(12) United States Patent
Cheng et al.

(10) Patent No.: US 9,239,192 B2
(45) Date of Patent: Jan. 19, 2016

(54) SUBSTRATE RAPID THERMAL HEATING SYSTEM AND METHODS

(71) Applicant: Taiwan Semiconductor Manufacturing Co., Ltd., Hsin-Chu (TW)

(72) Inventors: Nai-Han Cheng, Hsinchu (TW); Chi-Ming Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 169 days.

(21) Appl. No.: 13/771,260

(22) Filed: Feb. 20, 2013

(65) Prior Publication Data

US 2014/0235071 A1 Aug. 21, 2014

(51) Int. Cl.

| F26B 3/30 | (2006.01) |
|---|---|
| F26B 19/00 | (2006.01) |
| F27D 11/12 | (2006.01) |
| H01L 21/67 | (2006.01) |
| H01L 21/687 | (2006.01) |
| F27B 17/00 | (2006.01) |
| F27D 99/00 | (2010.01) |

(52) U.S. Cl.
CPC ............ *F27D 11/12* (2013.01); *F27B 17/0025* (2013.01); *F27D 99/0006* (2013.01); *H01L 21/67115* (2013.01); *H01L 21/68764* (2013.01); *H01L 21/68771* (2013.01)

(58) Field of Classification Search
None
See application file for complete search history.

(56) References Cited

U.S. PATENT DOCUMENTS

| 5,487,127 | A | * | 1/1996 | Gronet et al. | ................. 392/416 |
|---|---|---|---|---|---|
| 5,551,985 | A | * | 9/1996 | Brors et al. | ................... 118/725 |
| 5,859,408 | A | * | 1/1999 | Baxendine | ..................... 219/390 |
| 5,930,456 | A | * | 7/1999 | Vosen | ............................ 392/416 |
| 8,787,741 | B2 | * | 7/2014 | Kato | ............................. 392/416 |
| 2004/0013419 | A1 | * | 1/2004 | Sakuma et al. | ................ 392/411 |
| 2009/0041443 | A1 | * | 2/2009 | Aderhold et al. | ............. 392/411 |
| 2010/0068898 | A1 | | 3/2010 | Moffatt et al. | |
| 2012/0093492 | A1 | * | 4/2012 | Kato et al. | ..................... 392/411 |
| 2012/0108081 | A1 | * | 5/2012 | Olgado et al. | ................ 438/795 |

FOREIGN PATENT DOCUMENTS

| JP | 2000-130952 | 5/2000 |
|---|---|---|
| JP | 2012-503311 | 2/2012 |
| KR | 10-2009-0053150 | 5/2009 |
| WO | 2009066905 A1 | 5/2009 |

OTHER PUBLICATIONS

Official Action issued in corresponding Korean Patent Application No. 10-2013-0103938.

* cited by examiner

*Primary Examiner* — Thor Campbell
(74) *Attorney, Agent, or Firm* — Duane Morris LLP

(57) ABSTRACT

A method and apparatus for rapid thermal heat treatment of semiconductor and other substrates is provided. A number of heat lamps arranged in an array or other configuration produce light and heat radiation. The light and heat radiation is directed through a heat slot that forms a radiation beam of high intensity light and heat. The radiation beam is directed to a platen that includes multiple substrates. The apparatus and method include a controller that controls rotational and translational motion of the platen relative to the heat slot and also controls the power individually and collectively supplied to the heat lamps. A program is executed which maneuvers the platen such that all portions of all substrates receive the desired thermal treatment, i.e. attain a desired temperature for a desired time period.

20 Claims, 2 Drawing Sheets

SUBSTRATE RAPID THERMAL HEATING SYSTEM AND METHODS

TECHNICAL FIELD

The disclosure relates, most generally, to semiconductor device manufacturing methods and systems and more particularly, to methods and systems for heat treating substrates upon which semiconductor devices are being manufactured.

BACKGROUND

In the manufacture of integrated circuits and other semiconductor devices, the sequence of processing operations used to fabricate the devices on a substrate typically includes a number of heat treatment operations. The heat treatment operations include annealing operations, such as may be used following an ion implantation operation, silicidation heat treatment operations and other heat treatment operations used to modify properties of materials or structures of the bulk substrate itself or of material and devices formed on the substrate.

Post-implant annealing operations are carried out after ion implantation to activate implanted dopants and to repair implantation damage. Post-implant annealing is advantageously carried out using a thermal budget control, i.e. high temperature for a milli-second time, to avoid dopant diffusion. For this and other reasons, rapid thermal annealing, RTA, flash, and other rapid thermal processing, RTP operations, have become the favored heat treatment operations, as opposed to furnace operations, as semiconductor device processing technology continues to develop.

RTP and RTA utilize a number of individual relatively small-sized high intensity heat lamps that collectively flash at a high intensity for a short time to heat a substrate at a very high temperature with a short time. The heat lamps are generally positioned in close proximity to the substrate undergoing the heat treatment operation and therefore each heat lamp heats a corresponding proximate area of the substrate, so non-uniformities between the lamps result in uneven heating. Semiconductor devices are now being manufactured on substrates that can be 300 mm or 450 mm in diameter and this requires higher numbers of heat lamps and non-uniformities among the heat lamps can produce dramatic heating differences across the substrate surface. This results in material qualities that are inconsistent throughout the substrate and adversely affects device performance and functionality.

One objective that is always present in the semiconductor manufacturing industry is achieving a rapid cycle time. It is highly desirable and most cost-efficient to produce as many devices in a lot, i.e. a group of substrates, as quickly as possible. It is therefore critical to be able to process each substrate as quickly as possible and also to process as many substrates together as possible in various processing operations and apparatuses.

Heat treatment operations that provide uniformity of heating across a substrate and programmable thermal budget control of processing substrates are needed.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The disclosure provides a rapid thermal heat treatment apparatus and a method for heat treating semiconductor and other substrates. The disclosure provides for providing multiple high powered, high intensity heat lamps, arranging the heat lamps in an array or other configuration and focusing the heat radiation generated by the heat lamps through a heat slot to form a heat radiation beam of reduced size relative to the area within which the heat lamps are arranged, i.e. less than the area occupied by the heat lamps. The heat radiation beam is directed to a surface of a platen and has a beam area at the platen surface, i.e. the location at which the beam hits the platen. The platen includes at least one substrate receiving station. When multiple substrates are positioned on the platen, the platen is rotated and translated such that the heat radiation beam impinges upon and heats all portions of each of the substrates disposed on the platen.

The rapid thermal heating apparatus is an RTA apparatus in one embodiment and includes a controller that controls the translational and rotational movement of the platen and causes the platen and the substrates on the platen to be maneuvered with respect to the heat radiation beam, in one embodiment. The controller controls the rotation and translation according to various programs in various embodiments and such that each area of each substrate is heated by the heat radiation beam such that all areas of the substrate are heated to a desired temperature for a desired time, i.e. all areas of each of the substrates attain the same thermal budget. The controller also controls the power supplied to each of the heat lamps. In some embodiments, the controller is, or includes, a processor or microprocessor. In some embodiments, the processor receives a non-transitory computer readable storage media with program instructions. In some embodiments, the controller causes the rapid thermal heat treatment apparatus to carry out an annealing or other rapid thermal heating operation in accordance with the program instructions.

Figure 1:
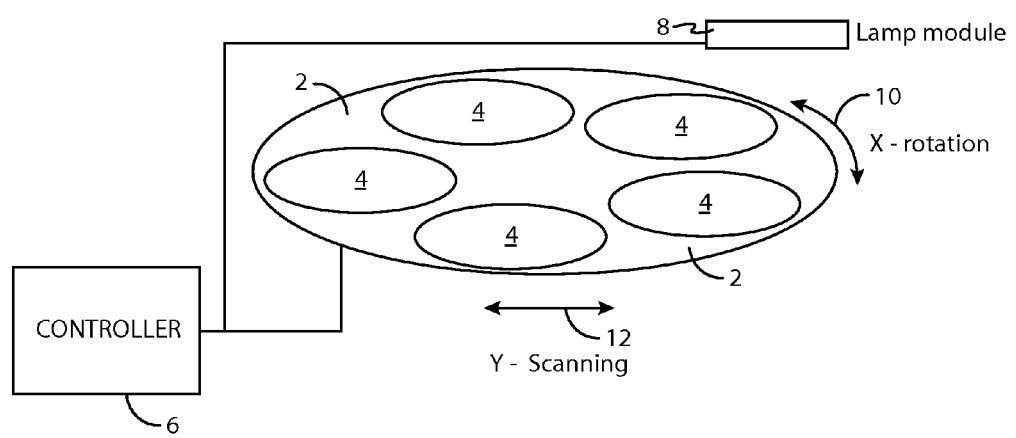
FIG. 1 is a perspective view showing a lamp module positioned with respect to a rotatable and translatable platen that includes five or several of substrates.

FIG. 1 is a schematic shown in partial perspective view showing platen 2 with five substrate receiving stations each retaining a substrate 4. Each substrate receiving station is a chuck or other member capable of receiving and securing a corresponding substrate 4 thereon. In some embodiments, the chuck is a vacuum chuck. Although five substrates 4 are shown in the embodiment illustrated in FIG. 1, in other embodiments, other numbers of substrate receiving stations are included and other numbers of substrates are received on platen 2. Substrates 4 are semiconductor wafers such as silicon wafers or other suitable substrates used in semiconductor manufacturing in various embodiments. In various embodiments, substrates 4 have various dimensions. In one embodiment, substrates 4 include a diameter of about 300 mm and in another embodiment, substrates 4 include a diameter of about 450 mm, but substrates with other sizes are used in other embodiments. In some embodiments, platen 2 is capable of receiving different sized substrates or can be retrofitted to include substrates of different sizes.

Substrates 4 are at various manufacturing stages and the rapid thermal operations carried out according to the disclosure include annealing, silicidation and other thermal operations.

Platen 2 is positioned within an apparatus with respect to lamp module 8. Platen 2 is capable of rotational motion indicated by arrow 10 and translational motion indicated by arrow 12. Controller 6 is coupled to platen 2 and controls the rotational and translational motion of platen 2 and therefore also of substrates 4 disposed on platen 2. The rotational motion of platen 2 includes clockwise and counterclockwise rotation and platen 2 is capable of rotating both clockwise and counterclockwise in various embodiments. Translational motion along the direction indicated by arrow 12 can be both left and right and in some embodiments translational motion is a continuous motion while in other embodiments translational motion is an incremental motion. According to the embodiment in which the translational motion is an incremental motion, the step size of the increments of motion vary in various embodiments. More particularly, controller 6 controls rotational and translational motion of platen 2 with respect to lamp module 8.

In some embodiments, substrates 4 are disposed on rotatable substrate receiving stations such that each substrate is individually rotatable. According to these embodiments, controller 6 also controls the rotation of the individual substrates 4.

Figure 2:
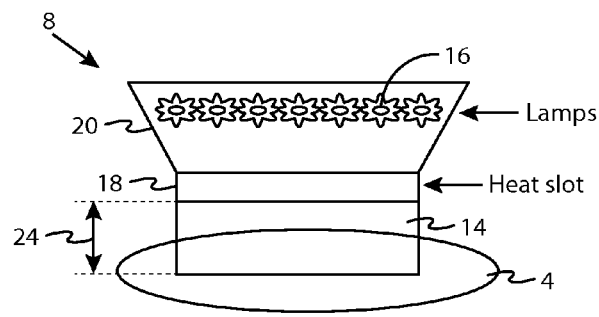
FIG. 2 is a perspective side view showing details of a lamp module with respect to a substrate.
Figure 3:
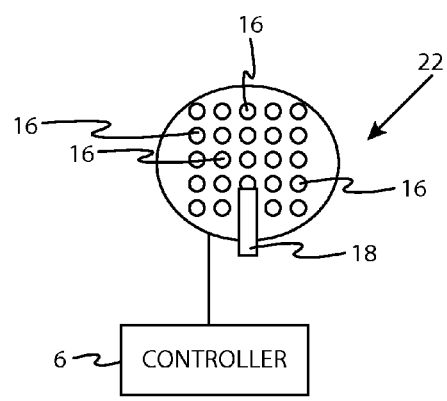
FIG. 3 is a plan view showing a heat module with multiple heat lamps and a heat slot.

Controller 6 is also coupled to lamp module 8 and controls the power supplied to the heat lamps of lamp module 8. The heat lamps are shown in FIGS. 2 and 3 and may advantageously be high-intensity heat lamps. Controller 6 controls the lamp intensity, the time the power is provided to the lamps and the particular lamps that are utilized throughout the heat treating or other annealing operation. Controller 6 controls the heat lamps both collectively and individually.

Various types of controllers are used as controller 6 in various embodiments. Controller 6 is electrically coupled to the heat lamps of heat module 8 and also to platen 2 to control translational and rotational motion of platen 2. In some embodiments, controller 6 includes a processor or microprocessor which is a multipurpose programmable device that accepts data as input, processes it according to instructions stored in its memory, and provides results as output. In some embodiments, the results are a program executed by controller 6 by controlling power supplied to the heat lamps, and platen 2. In some embodiments, controller 6 is a processor that receives program instructions from a non-transitory computer readable electronic storage medium. In some embodiments, the program instructions provide for carrying out an annealing or other heat treating operation such that all areas of all substrates 4 disposed on platen 2 receive the desired heat treatment.

FIG. 2 is a side, perspective view of lamp module 8 and substrate 4. Substrate 4 is disposed upon a platen such as platen 2 such as shown in FIG. 1. Lamp module 8 includes a number of heat lamps 16 and heat slot 18. In some embodiments, heat lamps 16 are high temperature power module type heat lamps. In some embodiments, heat lamps 16 are disposed within a chamber including walls 20 which aid in guiding the high-intensity light and heat provided by heat lamps 16 through heat slot 18 to form radiation beam 14.

Radiation beam 14 reaches substrate 4. Radiation beam 14 is characterized by a uniform thermal profile. The interior of walls 20 and the interior of heat slot 18 is formed of various opaque materials in some embodiments and is formed of reflective materials in some embodiments. The interior of walls 20 and heat slot 18 is formed of a material that guides and directs heat and light radiation through heat slot 18 and toward substrate 4 in the form of radiation beam 14. Various numbers of heat lamps 16 are used in various embodiments and heat slot 18 includes various dimensions in various embodiments. In the illustrated embodiment, heat lamps 16 are generally arranged in a plane and the walls of heat slot 18 are orthogonal to the plane of heat lamps 16 but in other embodiments, the walls of heat slot 18 are inwardly tapered or take on other configurations. Heat slot 18 is disposed distance 24 from substrate 4. Distance 24 is height controllable and takes on various values in various embodiments.

Heat lamps 16 are arranged in various two or three dimensional arrangements in various embodiments. FIG. 3 shows a number of heat lamps 16 disposed throughout area 22 in a two dimensional arrangement. Stated alternatively, heat lamps 16 occupy area 22. The heat radiation of all heat lamps 16 is directed through heat slot 18 to form a focused and intense beam of heat radiation such as radiation beam 14 shown in FIG. 2. The relative size of heat slot 18 and area 22 occupied by heat lamps 16, varies in various embodiments. The number of heat lamps 16 with respect to heat slot 18 also varies in various embodiments. FIGS. 2 and 3 illustrate that a number of heat lamps are positioned in various arrangements and the heat radiation generated from the heat lamps is directed through a heat slot disposed between the platen and heat lamps. Heat slot 18 provides a beam of light and heat radiation that is directed to a platen that includes one or multiple locations for receiving substrates. The beam of light and heat radiation is a high intensity light beam capable of heating substrates to a temperature of about 450° C. to about 1350° C. The beam of light and heat radiation includes a beam area at the plane of the substrate 4 as shown in FIG. 4.

Figure 4:
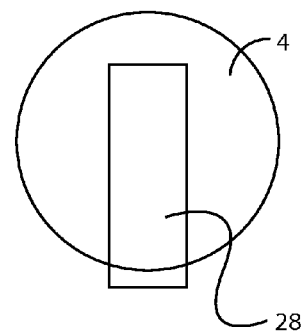
FIG. 4 shows an area where a radiation beam produced by a lamp module illuminates and heats a substrate according to one embodiment.

FIG. 4 is a plan view showing radiation beam area 28 superimposed on substrate 4 according to one embodiment. In some embodiments, substrate 4 rotates and/or translates individually with respect to the radiation beam indicated by radiation beam area 28. FIG. 4 shows that radiation beam area 28 is considerably smaller than the area of substrate 4. In one embodiment, radiation beam area 28 is less than about 10% of the area of substrate 4. In some embodiments, radiation beam area 28 is less than about 15% of the area of substrate 4. In other embodiments, radiation beam area 28 is less than about 20% of the area of substrate 4. Radiation beam area 28 is the area of the beam of light and beam radiation such as radiation beam 14 shown in FIG. 2, when it reaches substrate 4. Radiation beam area 28 is rectangular in the illustrated embodiment, but radiation beam area 28 includes different shapes in different embodiments. In some embodiments, radiation beam area 28 is square, and in other embodiments, radiation beam area 28 is round, oval, elliptical, or trapezoidal. In some embodiments, radiation beam area 28 is about the same size and about the same shape as substrate 4. Radiation beam area 28 ranges from about 1% to greater than 100% of the size of substrate 4. According to the embodiment in which radiation beam area 28 is about the same size and about the same shape as substrate 4, the heat lamps disposed on the other side of the heat slot are spread out over an area greater than the area of substrate 4 and radiation beam area 28.

According to all embodiments, the disclosure corrects for any non-uniformities between and among heat lamps 16 by directing the heat radiation through a heat slot having a smaller area than the area within which the heat lamps are disposed and which combines and focuses the light and heat output of the heat lamps. The heat slot directs a radiation beam having radiation beam area 28, which is smaller than the area within which the heat lamps are disposed.

Figure 5:
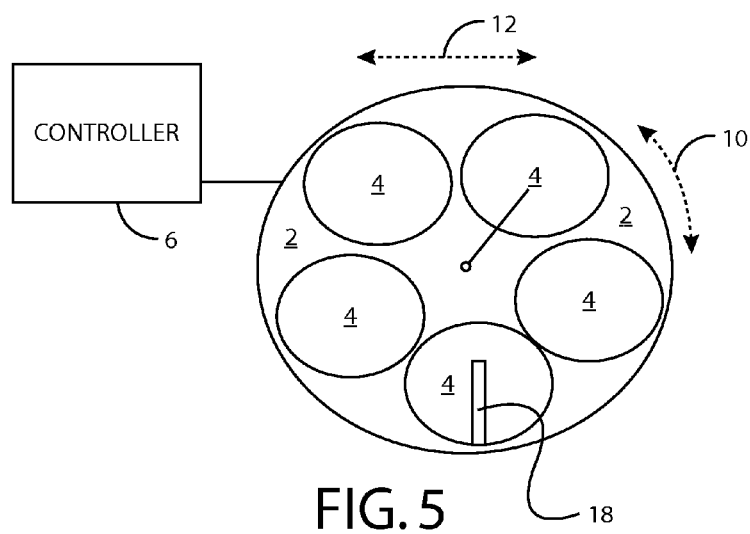
FIG. 5 is a top view showing a lamp module in relation to a rotatable and translatable platen that includes five substrates.

FIG. 5 shows platen 2 and is primarily a plan view and also shows controller 6. Platen 2 includes five substrates 4, each received in a corresponding substrate receiving station. In some embodiments, substrates 4 are firmly retained by platen 2 using a vacuum chuck or other securing means such that substrates 4 remain in position when platen 2 rotates at a high velocity. FIG. 5 shows controller 6 coupled to platen 2. Controller 6 controls the motion of platen 2 using any of various suitable mechanical means. Heat slot 18 is also shown in FIG. 5. Heat slot 18 is disposed between platen 2 and the high-intensity heat lamps such as heat lamps 16 shown in FIGS. 2 and 3. Heat slot 18 in conjunction with heat lamps 16 produces radiation beam area 28 such as shown in FIG. 4 but not illustrated in FIG. 5.

Controller 6 is also coupled to the heat lamps 16 such as shown in FIGS. 1 and 3. Still referring to FIG. 5, controller 6 controls translation along the directions indicated by double-headed arrow 12 and clockwise and/or counterclockwise rotation such as indicated by double-headed arrow 10. Controller 6 also controls the rotation of the substrates 4 according to embodiments in which substrates 4 are individually rotatable. In some embodiments, platen 2 rotates at a rate that ranges from about 10 to about 800 revolutions per minute. Controller 6 controls the heat intensity produced by the heat lamps and directed through heat slot 18. The disclosure provides for maneuvering platen 2 by translation and rotation such that all areas of each of substrates 4 are heat treated by radiation beam 14. In some embodiments, this is accomplished by simultaneous translation and rotation. In some embodiments, the translation is a continuous motion, and in other embodiments, the translation is an incremental motion. In some embodiments, the step size of each increment ranges from about 2 to about 22 mm or about 4 to 20 mm, but other step sizes are used in other embodiments. In some embodiments, each portion of each of the substrates is heated by radiation beam 14 multiple times as the motion of platen 2 is controlled such that each portion of each of substrates 4 passes under radiation beam 14 multiple times. In some embodiments each portion of each of the substrates is exposed to heat radiation beam 14 for a time in the millisecond or microsecond range and this exposure may take place once or multiple times during the rapid thermal processing operation.

It has been found that the methods and apparatus of the disclosure provide superior uniformity of beam current and temperature throughout and across a substrate. The superior uniformity of beam current and temperature produce superior thickness uniformity of films annealed using the methods and apparatus of the disclosure. In the one trial embodiment, in which the translational motion of platen 2 was an incremental motion with a step size of about 4.25 mm, a mean film thickness of 102.9 nm was achieved for a representative thin film that was annealed according to the methods and apparatus of the disclosure, with a standard deviation (3-sigma) of 3.5 nm (3.4%) and a range of 8.3 nm (4.0%). In another trial embodiment, in which a step size of incremental motion of about 4.25 mm was used in an annealing operation according to the methods and apparatus of the disclosure, a mean film thickness of 102.7 nm was obtained with a standard deviation (3-sigma) of 2.2 nm (2.1%) and with a range of only 3.0 nm (1.5%).

According to one aspect, the controller is, or includes, a processor and receives instructions from a non-transitory computer readable electronic storage medium. In other embodiments, controller 6 receives program instructions from various input devices such as a keyboard or a GUI (graphical user interface). In various embodiments, controller 6 executes program instructions and controls the motion of platen 2, the heat lamps and, in some embodiments, the individual substrates, in response to the program instructions. The instructions are for maneuvering platen 2 by rotation and translation and for powering the heat lamps such that all portions of the substrates 4 are heated to a predetermined temperature for a predetermined time. The instructions are carried out by the controller which controls rotation and translation of platen 2 and the power individually and collectively applied to the heat lamps.

In some embodiments, the heat treatment operation is an annealing operation, and in some embodiments, the annealing operation is a post-implantation annealing operation. In other operations, the heat treatment operation is a silicidation operation, and in still other embodiments, other heat treatment operations are carried out. The heating temperatures vary from about 450° C. to about 1350° C. and the annealing times are in the range of milliseconds to microseconds in various embodiments. According to the embodiment in which multiple exposures to the heat radiation beam 14 are used, the heat profile is controlled by the controller which controls the ramp-up of the heat lamps. In addition to controlling the power supplied to each heat lamp, controller 6 also controls the distribution of power supplied to the array of heat lamps. Controller 6 controls how many heat lamps are powered and which heat lamps are powered to distribute the power. Controller 6 thereby controls the resulting intensity of radiation beam 14 produced by directing the heat radiation of the heat lamps through heat slot 18.

In accordance with the disclosure, several substrates undergo a rapid heat treatment processing operation together and substantially simultaneously. Various routines for maneuvering the platen and substrates relative to the beam of heat radiation are used to anneal or otherwise heat treat all areas of the substrates. Because multiple substrates are processed substantially simultaneously, a high throughput for the rapid thermal processing apparatus is achieved as is a corresponding cycle time reduction. Issues related to any non-uniformity between the heat lamps are avoided.

A system for heat treating substrates is provided in accordance with the disclosure. The system comprises: a heat slot that directs heat from a plurality of heat lamps to at least a section of a platen, the platen having a plurality of substrate receiving stations and being rotatable and translatable with respect to the heat slot; and a controller that controls rotation and translation of the platen such that all portions of each of a plurality of substrates received on the substrate receiving stations are heated by the heat directed by the heat slot.

In another aspect of the disclosure, a method for heat treating substrates is provided. The method comprises: directing heat radiation from a plurality of heat lamps through a heat slot thereby forming a heat radiation beam and directing the heat radiation beam onto a beam area portion on a platen; positioning a plurality of substrates on the platen; rotating the platen; and translating the platen relative to the heat slot, wherein the rotating and translating cause the heat radiation beam to heat all portions of each substrate.

In another aspect of the disclosure, a method for heat treating substrates is provided. The method comprises: providing a beam of heat radiation having a beam area at a surface level; providing a plurality of substrates on a platen at the surface level, each substrate having an area greater than the beam area; and maneuvering the platen according to a program that causes motion of the platen along the surface level, such that all areas of each of the substrates are exposed to the beam of heat radiation.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A system for heat treating substrates, said system comprising:
    a lamp module including at least one wall defining a heat slot that directs heat from a plurality of heat lamps to at least a section of a platen, said platen having a plurality of substrate receiving stations and being rotatable and translatable with respect to said lamp module, wherein said at least one wall tapers from a first size adjacent to the plurality of heat lamps to a second size at the heat slot, wherein the second size is smaller than the first size, and wherein said heat slot is disposed between said platen and said plurality of heat lamps; and
    a controller that controls rotation and translation of said platen such that all portions of each of a plurality of substrates received on said substrate receiving stations are heated by said heat directed by said heat slot.

2. The system as in claim 1, wherein said plurality of substrate receiving stations comprise at least five said substrate receiving stations.

3. The system as in claim 1, wherein said platen is translatable one of continuously and incrementally.

4. The system as in claim 1, wherein said heat slot directs a beam of said heat onto an area substantially the same size as an area of one of said substrate receiving stations and wherein said plurality of heat lamps are disposed throughout an area greater than said area of one of said substrate receiving stations.

5. The system as in claim 1, wherein said heat slot directs a beam of said heat onto an area having an area less than about 15% of a size of one of said substrate receiving stations.

6. The system as in claim 1, wherein said heat slot directs a beam of said heat onto a beam area of said platen and said heat lamps are arranged over an area greater than said beam area.

7. The system as in claim 1, wherein said controller further controls power supplied to said heat lamps.

8. The system as in claim 7, wherein said controller individually controls heat intensity of each of said plurality of heat lamps.

9. The system as in claim 7, wherein said controller includes a processor that receives program instructions from a non-transitory computer readable electronic storage medium and causes said controller to execute a program that causes all said portions of each said substrate received on said substrate receiving stations to attain a predetermined temperature for a predetermined time.

10. A method for heat treating substrates using the system of claim 1, said method comprising:
    directing heat radiation from a plurality of heat lamps through a heat slot thereby forming a heat radiation beam and directing said heat radiation beam onto a beam area portion on a platen;
    positioning a plurality of substrates on said platen;
    rotating said platen; and
    translating said platen relative to said heat slot,
    wherein said rotating and translating cause said heat radiation beam to heat all portions of each said substrate.

11. The method as in claim 10, wherein said rotating includes a speed of about 10-800 revolution per minute, said rotation and said translating occur simultaneously, said substrates comprise semiconductor substrates and said method is an annealing operation.

12. The method as in claim 10, wherein said translating comprises said platen translating incrementally with respect to said heat slot.

13. The method as in claim 12, wherein said translating incrementally includes a step size of about 4-20 mm and said beam area is less than about 15% of an area of said substrate.

14. The method as in claim 10, further comprising providing a controller and said controller controlling power supplied to said heat lamps and said rotating and translating such that all said portions of each said substrate attain a predetermined temperature for a predetermined time.

15. The method as in claim 10, wherein said rotating and translating cause all said portions of each said substrate attain a predetermined temperature for a predetermined time.

16. A method for rapid thermal heat treatment of substrates using the system of claim 1, said method comprising:
    providing a beam of heat radiation having a beam area at a surface level;
    providing a plurality of substrates on a platen disposed substantially at said surface level, each substrate having an area greater than said beam area; and maneuvering said platen according to a program that causes motion of said platen along said surface level, such that all areas of each of said substrates are exposed to said beam of heat radiation.

17. The method as in claim 16, wherein all said areas of each of said substrates are exposed to said beam of heat radiation a plurality of times and each said area of each of said substrates achieves a predetermined temperature for a predetermined time.

18. The method as in claim 16, wherein said maneuvering comprises rotating and translating and said maneuvering causes said all areas of each of said substrates to be exposed to said beam of heat radiation for a time in the millisecond or microsecond range.

19. The system as in claim 1, wherein said at least one wall comprises a reflective coating disposed over an inner surface of said wall.

20. The system as in claim 1, wherein said at least one wall comprises an opaque wall.

* * * * *